(12) United States Patent
Forbes

(10) Patent No.: US 7,256,451 B2
(45) Date of Patent: Aug. 14, 2007

(54) NROM MEMORY DEVICE WITH A HIGH-PERMITTIVITY GATE DIELECTRIC FORMED BY THE LOW TEMPERATURE OXIDATION OF METALS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/199,827

(22) Filed: Aug. 9, 2005

(65) Prior Publication Data

US 2005/0280045 A1 Dec. 22, 2005

Related U.S. Application Data

(62) Division of application No. 10/808,059, filed on Mar. 24, 2004.

(51) Int. Cl.
*H01L 29/792* (2006.01)
(52) U.S. Cl. ............... 257/325; 257/310; 257/411; 257/E29.309
(58) Field of Classification Search ........... 257/309, 257/324, 410, 411, E29.309, 310, 325
See application file for complete search history.

(56) References Cited

U.S. PATENT DOCUMENTS

| 6,514,831 | B1 | 2/2003 | Liu |
| 6,562,491 | B1 * | 5/2003 | Jeon ............... 428/697 |
| 6,599,801 | B1 | 7/2003 | Chang et al. |
| 6,784,483 | B2 | 8/2004 | Chen |
| 6,830,963 | B1 | 12/2004 | Forbes |
| 6,838,869 | B1 | 1/2005 | Rogers et al. |
| 2002/0055230 | A1 | 5/2002 | Chang |
| 2002/0086548 | A1 | 7/2002 | Chang |
| 2003/0032224 | A1 | 2/2003 | Sung et al. |
| 2003/0183870 | A1 | 10/2003 | Sugiyama |
| 2003/0211690 | A1 | 11/2003 | Chung |
| 2004/0043622 | A1 | 3/2004 | Chen |
| 2005/0169055 | A1 * | 8/2005 | Lung ............... 365/185.17 |
| 2005/0173755 | A1 | 8/2005 | Forbes |
| 2005/0275011 | A1 | 12/2005 | Forbes |
| 2006/0019453 | A1 | 1/2006 | Forbes |

OTHER PUBLICATIONS

Min She et al., *19th IEEE Non-Volatile Semiconductor Memory Workshop 2003*, p. 53-55, "Improved SONOS-type Flash Memory Using HfO$_2$ as Trapping Layer".

(Continued)

*Primary Examiner*—Marcos D. Pizarro
(74) *Attorney, Agent, or Firm*—Leffert Jay & Polglaze, PA

(57) ABSTRACT

A high permittivity gate dielectric formed by low temperature metal oxidation is used in an NROM memory cell. The gate dielectric has a dielectric constant greater than silicon dioxide and is comprised of a nanolaminate structure. The NROM memory cell has a substrate with doped source/drain regions. The high-k gate dielectric is formed above the substrate. A polysilicon control gate is formed on top of the gate dielectric. The gate dielectric may have an oxide-high-k dielectric-oxide composite structure or an oxide-oxide-high-k dielectric composite structure.

18 Claims, 2 Drawing Sheets

OTHER PUBLICATIONS

Sugizali et al., *19th IEEE Non-Volatile Semiconductor Memory Workshop 2003*, p. 60-61, "New 2-bit/Tr MONOS Type Flash Memory using . . . ".

Shin et al., *19th IEEE Non-Volatile Semiconductor Memory Workshop 2003*, p. 58-59, "High Reliable SONOS-type NAND Flash Memory Cell with $Al_2O_3$ for Top Oxide".

Blomme et al., *19th IEEE Non-Volatile Semiconductor Memory Workshop 2003*, p. 93-94, "A Novel Low Voltage Memory Device with an Engineered $SiO_2$ /high-k tunneling barrier".

Maayan et al., *ISSCC 2002 Visual Supplement*, p. 76-77,407-408, "A 512Mb NROM Flash Data Storage Memory with 8MB/s Data Rate".

Eitan et al., Nov. 2000, *IEEE Electron Device Letters*, vol. 21, No. 11, p. 543-545, "NROM: A Novel Localized Trapping, 2-Bit Non-volatile Memory Cell".

Lusky et al., Nov. 2001, *IEEE Electron Device Letters*, vol. 22, No. 11, p. 556-558, "Characterization of Channel Hot Electron Injection by the Subthreshold Slope . . . ".

* cited by examiner

NROM MEMORY DEVICE WITH A HIGH-PERMITTIVITY GATE DIELECTRIC FORMED BY THE LOW TEMPERATURE OXIDATION OF METALS

CROSS-REFERENCE TO RELATED APPLICATION

This application is a Divisional of U.S. patent application Ser. No. 10/808,059, filed Mar. 24, 2004 and titled, "NORM MEMORY DEVICE WITH A HIGH-PERMITTIVITY GATE DIELECTRIC FORMED BY THE LOW TEMPERATURE OXIDATION OF METALS," which is commonly assigned and incorporated by reference in its entirety herein.

TECHNICAL FIELD OF THE INVENTION

The present invention relates generally to memory devices and in particular the present invention relates to NROM memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory. One type of flash memory is a nitride read only memory (NROM). NROM has some of the characteristics of flash memory but does not require the special fabrication processes of flash memory. NROM integrated circuits can be implemented using a standard CMOS process.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

The performance of flash memory transistors needs to increase as the performance of computer systems increases. To accomplish a performance increase, the transistors can be reduced in size. This has the effect of increased speed with decreased power requirements.

However, a problem with decreased flash memory size is that flash memory cell technologies have some scaling limitations. For example, stress induced leakage typically requires a tunnel oxide above 60 Å. This thickness results in a scaling limit on the gate length. Additionally, this gate oxide thickness limits the read current and may require large gate widths.

For the reasons stated above, and for other reasons stated below which will become apparent to those skilled in the art upon reading and understanding the present specification, there is a need in the art for a more scalable, higher performance flash memory transistor.

SUMMARY

The above-mentioned problems with flash memory scaling and performance and other problems are addressed by the present invention and will be understood by reading and studying the following specification.

The present invention encompasses an NROM flash memory transistor with a high permittivity gate dielectric formed by the low temperature oxidation of metals. The transistor is comprised of a substrate with a plurality of source/drain regions. The source/drain regions have a different conductivity than the substrate into which they are doped.

A high-k gate dielectric is formed on the substrate. The gate dielectric has a high dielectric constant that is greater than silicon dioxide. The gate dielectric can be an atomic layer deposited and/or evaporated nanolaminate gate dielectric and metal that is oxidized by a low temperature oxidation process. A control gate is formed on top of the oxide insulator.

Further embodiments of the invention include methods and apparatus of varying scope.

DETAILED DESCRIPTION

Figure 1:
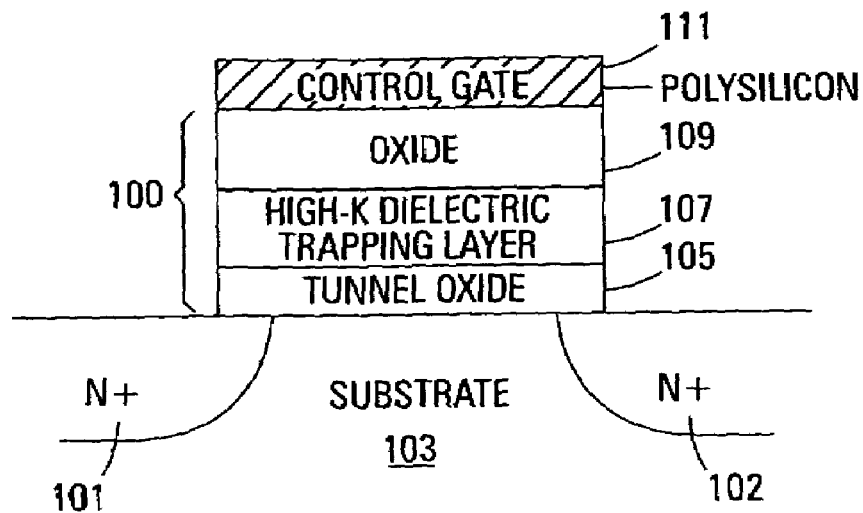
FIG. 1 shows a cross-sectional view of one embodiment of an NROM flash memory cell transistor of the present invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a cross-sectional view of one embodiment of a nitride read only memory (NROM) flash memory cell transistor of the present invention. In order to improve the programming speed and/or lower the programming voltage of an NROM device, it is desirable to use a trapping material with a lower conduction band edge (i.e., a higher electron affinity) to achieve a larger offset as well as to provide for programming by direct tunneling at low voltages. The NROM transistor of the present invention uses a high permittivity (high-k) dielectric layer formed by the low temperature oxidation of metals as a trapping layer.

High-k dielectric materials (e.g., $HfO_2$ and $ZrO_2$) have a lower conduction band edge than the prior art trapping material, silicon nitride. If $HfO_2$ were used as a trapping layer, the offset would be 1.7 eV. This is significantly better than the 1.2 eV associated with a prior art nitride trapping layer. It would thus be advantageous to use a high-k material as the trapping layer in an NROM-type memory device.

Referring to FIG. 1, the NROM transistor is comprised of two source/drain regions 101 and 102 doped into the substrate 103. In one embodiment, these are n+ regions and the substrate is p-type silicon. However, the present invention is not limited to any conductivity type.

A tunnel oxide layer 105 is formed on the substrate 103 between the source/drain regions 101 and 102. The high dielectric constant trapping layer 107 is formed on top of the tunnel oxide layer 105 and another oxide layer 109 is formed on top of the trapping layer 107. The oxide-high-k dielectric-oxide layers 105, 107, and 109 form a composite gate insulator 100 under the polysilicon control gate 111.

One embodiment of a nanolaminate gate insulator of the present invention is the deposited oxide-metal being oxidized-final deposited oxide composite where the metal oxides are formed by the low temperature oxidation of metals. Another embodiment is an oxide-nitride-high-k composite where the metal oxides are formed by the oxidation of metals. Yet another embodiment is a high-k-high-k-high-k composite where one or more of the high-k dielectric layers are formed by the oxidation of metals.

In one embodiment, the nanolaminate gate insulator 100 can be fabricated by atomic layer deposition (ALD), an evaporation technique, a combination of the ALD and evaporation, or any other fabrication method. These fabrication methods are well known in the art. Various methods for the fabrication of the metal oxide tunnel barriers of the present invention are discussed subsequently. Processing details that are not expressly set forth are well known to one skilled in the art.

The oxide growth rate and limiting thickness increases with oxidation temperature and oxygen pressure. The oxidation kinetics of a metal may, in some cases, depend on the crystallographic orientations of the very small grains of metal that comprise the metal films of the present invention. If such effects are significant, the metal deposition process can be modified in order to increase its preferred orientation and subsequent oxide thickness and tunneling uniformity. To this end, use can be made of the fact that metal films strongly prefer to grow during their depositions having their lowest free energy planes parallel to the film surface. This preference varies with the crystal structure of the metal. Metal orientation effects, if present, would be larger when only a limited fraction of the metal will be oxidized and unimportant when most or all of the metal is oxidized.

The simplest nanolaminates with high-k dielectrics are oxide-high-k dielectric-oxide composites. Since silicon dioxide has a low electron affinity and high conduction band offset with respect to the conduction band of silicon (3.2 eV), these nanolaminates have a high barrier, $\Phi$, between the high-k dielectric and the oxide. If the trapping center energies ($E_t$) in the high-k dielectrics are large, other high-k dielectrics with a smaller barrier ($\Phi$) can be used.

Embodiments of oxide-high-k dielectric-oxide composites of the present invention can include: oxide-$HfO_2$-oxide (where the Hf is oxidized to form the $HfO_2$), oxide-$ZrO_2$-oxide (where the Zr is oxidized to form the $ZrO_2$), and oxide-$Al_2O_3$-oxide (where the Al is oxidized to form the $Al_2O_3$). Alternate embodiments may include other dielectric materials.

Another class of nanolaminates avoids tunneling between the trapping centers in the nitride layer of a conventional NROM device and the control gate. High-k dielectrics, in one embodiment, can be used as the top layer in the gate insulator nanolaminate. Since they have a much higher dielectric constant than silicon oxide, these layers can be much thicker and still have the same capacitance. The thicker layers avoid tunneling to the control gate that is an exponential function of electric fields but have an equivalent oxide thickness that is much smaller than their physical thickness.

Embodiments of this category of oxide-nitride-high-k dielectric layers nanolaminates include: oxide-nitride-$Al_2O_3$ (where the Al is oxidized to form the $Al_2O_3$), oxide-nitride-$HfO_2$ (where the Hf is oxidized to form the $HfO_2$), and oxide-nitride-$ZrO_2$ (where the Zr is oxidized to form the $ZrO_2$). Alternate embodiments may include other dielectric materials.

In creating an NROM memory transistor with a high-k gate dielectric formed by low temperature oxidation of metal, as illustrated in FIG. 1, the metal layer or layers are first deposited using ALD, evaporation, sputtering, or other techniques for forming the metal layer. The metal oxides are then formed.

As is well known in the art, ALD is based on the sequential deposition of individual monolayers or fractions of a monolayer in a well-controlled manner. Gaseous precursors are introduced one at a time to the substrate surface. Between the pulses the reactor is purged with an inert gas or evacuated.

In the first reaction step, the precursor is saturatively chemisorbed at the substrate surface and during subsequent purging the precursor is removed from the reactor. In the second step, another precursor is introduced on the substrate and the desired films growth reaction takes place. After that reaction, byproducts and the precursor excess are purged from the reactor. When the precursor chemistry is favorable, one ALD cycle can be performed in less than one second in a properly designed flow-type reactor.

The most commonly used oxygen source materials for ALD are water, hydrogen peroxide, and ozone. Alcohols, oxygen and nitrous oxide have also been used. Of these, oxygen reacts very poorly at temperatures below 600° C. but the other oxygen sources are highly reactive with most of the metal compounds listed above.

Source materials for the above-listed metals include: zirconium tetrachloride ($ZrCl_4$) for the Zr film, titanium tetraisopropoxide ($Ti(OCH(CH_3)_2)_4$) for the Ti film, trimethyl aluminum ($Al(CH_3)_3$) for the Al film, chromyl chromide ($CrO_2Cl_2$) for the Cr film, praseodymium chloride ($PrCl_3$) for the Pr film, and hafnium chloride ($HfCl_4$) for the Hf film. Alternate embodiments use other source materials.

Thin oxide films are deposited at a temperature that is high enough such that, when it is adsorbed to the substrate surface, the vaporized source material reacts with a molecular layer of a second source material or that the vaporized source material becomes adsorbed and reacts with the second source material directed to the substrate surface in the subsequent step. On the other hand, the temperature should be low enough such that thermal breakdown of the source material does not occur or that its significance in terms of the total growth rate of the film is very small. Regarding the above-listed metals, the ALD process is carried out at a temperature range of approximately 200-600° C. Alternate embodiments use other temperature ranges.

In another embodiment of the NROM memory transistor of the present invention, the high-k dielectric layers can be fabricated using evaporation techniques. Various evaporation techniques are subsequently described for some of the high dielectric constant materials listed above.

Very thin films of $TiO_2$ can be fabricated with electron-gun evaporation from a high purity $TiO_2$ slug (e.g., 99.9999%) in a vacuum evaporator in the presence of anion beam. In one embodiment, an electron gun is centrally located toward the bottom of the chamber. A heat reflector and a heater surround the substrate holder. Under the substrate holder is an ozonizer ring with many small holes directed to the wafer for uniform distribution of ozone that is needed to compensate for the loss of oxygen in the evaporated $TiO_2$ film. An ion gun with a fairly large diameter (3-4 in. in diameter) is located above the electron gun and argon gas is used to generate Ar ions to bombard the substrate surface uniformly during the film deposition to compact the growing $TiO_2$ film.

A two-step process is used in fabricating a high purity $HfO_2$ film. This method avoids the damage to the silicon surface by Ar ion bombardment, such as that encountered during Hf metal deposition using dc sputtering. A thin Hf film is deposited by simple thermal evaporation. In one embodiment, this is by electron-beam evaporation using a high purity Hf metal slug (e.g., 99.9999%) at a low substrate temperature (e.g., 150°-200° C.). Since there is no plasma and ion bombardment of the substrate (as in the case of sputtering), the original atomically smooth surface of the silicon substrate is maintained. The second step is oxidation to form the desired $HfO_2$.

A two step process in fabricating a high-purity $ZrO_2$ film avoids the damage to the silicon surface by Ar ion bombardment. A thin Zr film is deposited by simple thermal evaporation. In one embodiment, this is accomplished by electron beam evaporation using an ultra-high purity Zr metal slug (e.g., 99.9999%) at a low substrate temperature (e.g., 150°-200° C.). Since there is no plasma and ion bombardment of the substrate, the original atomically smooth surface of the silicon substrate is maintained. The second step is the oxidation to form the desired $ZrO_2$.

The fabrication of $Y_2O_3$ and $Gd_2O$ films may be accomplished with a two step process. In one embodiment, an electron gun provides evaporation of high purity (e.g., 99.9999%) Y or Gd metal followed by low-temperature oxidation technology by microwave excitation in a $Kr/O_2$ mixed high-density plasma at 400° C. The method of the present invention avoids damage to the silicon surface by Ar ion bombardment such as that encountered during Y or Gd metal deposition sputtering. A thin film of Y or Gd is deposited by thermal evaporation. In one embodiment, an electron-beam evaporation technique is used with an ultra-high purity Y or Gd metal slug at a low substrate temperature (e.g., 150°-200° C.). Since there is no plasma or ion bombardment of the substrate, the original atomically smooth surface of the silicon substrate is maintained. The second step is the oxidation to form the desired $Y_2O_3$ or $Gd_2O_3$.

The desired high purity of a $PrO_2$ film can be accomplished by depositing a thin film by simple thermal evaporation. In one embodiment, this is accomplished by an electron-beam evaporation technique using an ultra-high purity Pr metal slug at a low substrate temperature (e.g., 150°-200° C.). Since there is no plasma and ion bombardment of the substrate, the original atomically smooth surface of the silicon substrate is maintained. The second step includes the oxidation to form the desired $PrO_2$.

The nitridation of the $ZrO_2$ samples comes after the low-temperature oxygen radical generated in high-density Krypton plasma. The next step is the nitridation of the samples at temperatures >700° C. in a rapid thermal annealing setup. Typical heating time of several minutes may be necessary, depending on the sample geometry.

The fabrication of lanthanum aluminate ($LaAlO_3$) films has been achieved by evaporating single crystal pellets on Si substrates in a vacuum using an electron-beam gun. The evaporation technique of the present invention uses a less expensive form of dry pellets of $Al_2O_3$ and $La_2O_3$ using two electron guns with two rate monitors. Each of the two rate monitors is set to control the composition. The composition of the film, however, can be shifted toward the $Al_2O_3$ or $La_2O_3$ side depending upon the choice of dielectric constant. After deposition, the wafer is annealed ex situ in an electric furnace at 700° C. for ten minutes in $N_2$ ambience. In an alternate embodiment, the wafer is annealed at 800° C.-900° C. in RTA for ten to fifteen seconds in $N_2$ ambience.

Another example is Lead Oxide (PbO) dielectrics that may be controllably grown on deposited lead films using either thermal oxidation or RF sputter etching in an oxygen plasma. One processing sequence using such a thermal oxidation process includes starting with a clean substrate and depositing a clean lead film on the oxide gate insulator at about 25° C. to 75° C. in a clean vacuum system. In one embodiment, the base pressure is approximately $10^{-8}$ Torr or lower. The Pb film will have a thickness within 1-2 Å of its target value.

In one embodiment, lead and other metal films are deposited by a physical sputtering process. The sputtering process offers the ability to produce smoother films by increasing the re-sputtering-to-deposition ratio since re-sputtering preferentially reduces geometric high points of the film.

A low temperature oxidation process is then used to grow an oxide film of self-limited thickness. In one embodiment, oxygen gas is introduced at the desired pressure in order to oxidize the lead in situ without an intervening exposure to ambient air. For a fixed oxygen pressure and temperature, the PbO thickness increases with log(time). Its thickness can be controlled via time or other parameters to within 0.10 Å as determined via in situ ellipsometric or ex situ measurements of Josephson tunneling currents. This control over tunnel current is due to the excellent control over PbO thickness that can be achieved by low temperature oxidation.

For example, increasing the oxidation time from 100 to 1,000 minutes at an oxygen pressure of 750 Torr at 25° C. only raises the PbO thickness by 3 Å (e.g., from about 21 Å to 24 Å). Accordingly, controlling the oxidation time to within 1 out of a nominal 100 minute total oxidation time provides a thickness that is within 0.1 Å of 21 Å. The PbO has a highly stoichiometric composition throughout its thickness as evidenced from ellipsometry and the fact that the tunnel barrier heights are identical for Pb/PbO/Pb structures.

Next, the system is re-evacuated and the top dielectric layer or top control gate electrode is deposited. The temperature used to subsequently deposit the polysilicon control gate is not critical. The PbO is stable to over 500° C. and thus introduces no temperature constraints on subsequent processes.

In another embodiment, $Al/Al_2O_3$ structures can be formed where the oxide is grown by low temperature oxidation in molecular or plasma oxygen. Capacitance and tunnel measurements indicate that the $Al_2O_3$ thickness increases with the log(oxidation time). This is similar to that found for PbO/Pb as well as other oxide/metal systems.

Additionally, tunnel currents for an $Al_2O_3$ tunnel barrier are asymmetrical with somewhat larger currents flowing when electrons are injected from the $Al/Al_2O_3$ interface that is developed during oxide growth. This asymmetry is due to a minor change in the composition of the growing oxide. There is a small concentration of excess metal in the $Al_2O_3$, the concentration of which diminishes as the oxide is grown thicker. The excess Al ions produce a space charge that lowers the tunnel barrier at the inner interface. The oxide composition at the outer $Al_2O_3$/Al contact is much more stoichiometric and thus has a higher tunnel barrier. In spite of this minor complication, Al/$Al_2O_3$/Al tunneling barriers can be formed that produce predictable and highly controllable tunnel currents that can be ejected from either electrode. The magnitude of the currents is still primarily dominated by $Al_2O_3$ thickness that can be controlled via the oxidation parametrics.

In one embodiment of the present invention, $Al_2O_3$ metal oxide dielectrics can be formed by first thermally oxidizing the aluminum. In other embodiments, the aluminum is plasma oxidized or other oxidation methods can be used. Since the melting point of aluminum is much higher than lead, the formation of the Al/$Al_2O_3$ structures are typically simpler than that used for the above-described Pb/PbO structures.

In the $Al_2O_3$ metal dielectric process of the present invention, the aluminum is sputter deposited on an oxide or other insulator at a temperature in the range of approximately 25° C. to 150° C. Due to thermodynamic forces, the micro-crystals of the face centered cubic (f.c.c.) aluminum will have a strong and desirable preferred orientation.

The aluminum is then oxidized in situ in molecular oxygen using temperature, pressure, and time to obtain the desired $Al_2O_3$ thickness. As with the lead oxide, the thickness of the aluminum increases with log(time) and can be controlled via time at a fixed oxygen pressure and temperature to within 0.10 Å when averaged over a large number of aluminum grains that are present under the counter-electrode. The thickness of the $Al_2O_3$ can be easily changed from about 15 Å to 35 Å by using appropriate oxidation parametrics. The oxide will be amorphous and remain so until temperatures in excess of 400° C. are reached. The initiation of re-crystallization and grain growth can be suppressed, if desired, by the addition of small amounts of glass forming elements (e.g., Si) without altering the growth kinetics or barrier heights significantly.

The system is then re-evacuated and a dielectric layer can be deposited over the oxidized $Al_2O_3$ layer if desired. Finally, the polysilicon control gate layer is formed, using conventional processes that are well known in the art.

In additional embodiments, single layers of $Ta_2O_5$, $TiO_2$, $ZrO_2$, $Nb_2O_5$ and similar transition metal oxides can be formed by low temperature oxidation of transition metal films in molecular and plasma oxygen. They can also be formed by RF sputtering in an oxygen plasma or using other methods.

These metals oxidize via logarithmic kinetics to reach thicknesses of a few angstroms to tens of thousands of angstroms in a temperature range of 100° C. to 300° C. Excellent oxide barriers for Josephson tunnel devices can be formed by RF sputter etching these metals in an oxygen plasma indicative of high quality dielectrics.

Lower temperature oxidation approaches of the present invention differ considerably from Metal-Organic Chemical Vapor Deposition (MOCVD) processes that are used to produce transition metal oxides. The MOCVD films typically require high temperature oxidation treatments to remove carbon impurities, improve oxide stoichiometry, and produce re-crystallization. Such high temperature treatments might also cause unwanted interactions between the oxide and the underlying silicon and, thus, necessitate the introduction of interfacial barrier layers.

In the processes of the present invention, control over the properties of the various transition metal oxides is improved from the prior art due to the limited thicknesses (approximately 10 Å to 100 Å) of metal that precludes the formation of significant quantities of unwanted sub-oxide films. This is due to thermodynamic forces driving the oxide compositions to their most stable oxidized state. In one embodiment, the duplex oxide layers are still crystallized. Such treatments can be done by RTP and will be shorter than those used on MOCVD and sputter deposited oxides since the stoichiometry and purity of the low temperature oxides need not be adjusted at high temperatures.

The above-described processes for low temperature oxidation of various metals are for purposes of illustration only. The present invention is not limited to any one process for low temperature oxidation.

In one embodiment of the NROM memory device with a high-k gate dielectric formed by low temperature metal oxidation of the present invention, a stack of oxide films can be used, each film having different properties. For example, a stack might be comprised of a "high-k dielectric oxide/low-k oxide/high-k oxide". Low temperature oxidation of metals can also be used to form other thin film dielectrics such as nitrides and oxynitrides.

The embodiments of the present invention might also employ low temperature oxidation and short thermal treatments in an inert ambient atmosphere at 700° C. in order to form a range of perovskite oxide films from parent alloy films. The dielectric constants of crystallized perovskite oxides can be very large (i.e., 100 to 1000). The transition metal layers can be either pure metals or alloys and the transition metals have similar metallurgy to their oxides. In contrast, the parent alloy films that can be converted to a perovskite oxide are typically comprised of metals having widely different chemical reactivities with oxygen and other common gasses.

Figure 2:
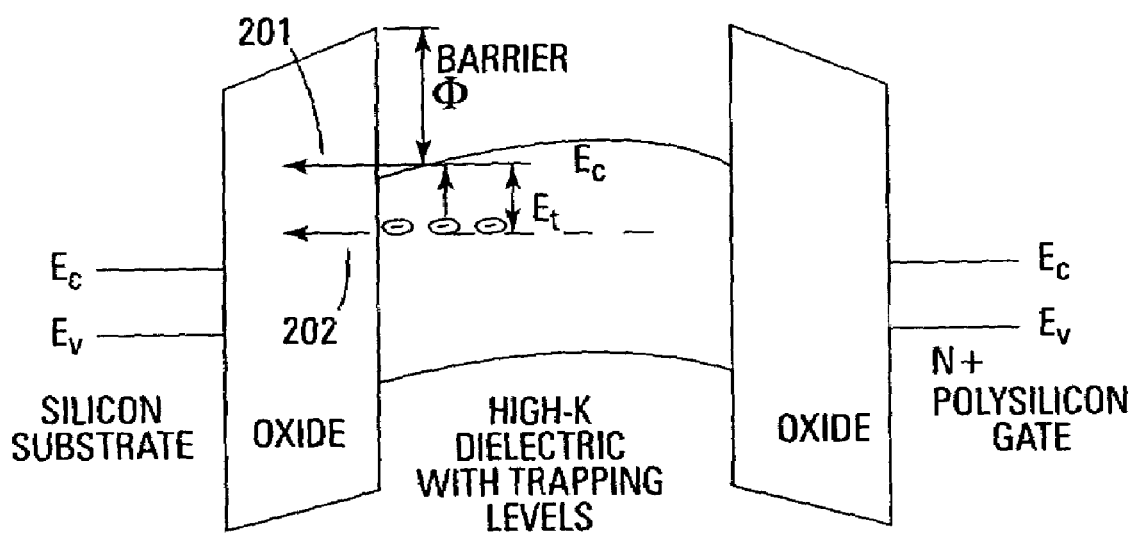
FIG. 2 shows an energy-band diagram in accordance with one embodiment of an NROM transistor of the present invention.

FIG. 2 illustrates an energy band diagram of the charge mechanisms in NROM memory devices. These mechanisms include direct tunneling 202 and thermal excitation 201 into the conduction band of the trapping layer and then tunneling through the barrier, $\Phi$. $E_t$ is the trapping energy in the high-k dielectric or nitride.

If the trapping centers have a large energy difference, $E_t$, with respect to the conduction band edge in the trapping layer, then other high-k dielectrics can be used even though they have a small barrier with silicon dioxide. Additional nanolaminate structures are also possible. High-k dielectrics may be used as the top dielectric insulator to increase the physical thickness of this layer to avoid tunneling to and from the control gate. In such an embodiment, an oxide-nitride-high-k dielectric nanolaminate composite layer can be employed.

Figure 3:
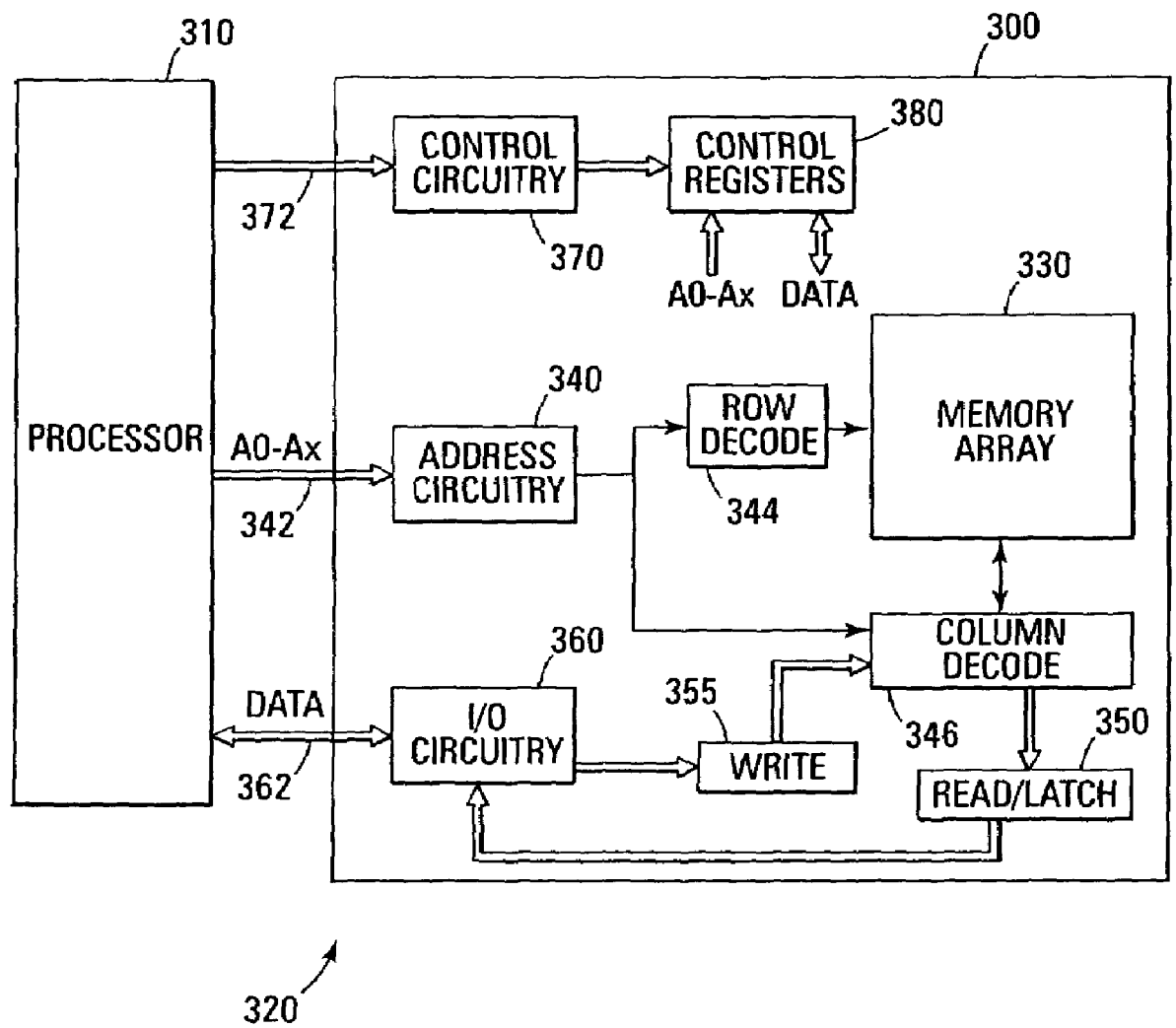
FIG. 3 shows a block diagram of an electronic system of the present invention.

FIG. 3 illustrates a functional block diagram of a memory device 300 that can incorporate the flash memory cells of the present invention. The memory device 300 is coupled to a processor 310. The processor 310 may be a microprocessor or some other type of controlling circuitry. The memory device 300 and the processor 310 form part of an electronic system 320. The memory device 300 has been simplified to focus on features of the memory that are helpful in understanding the present invention.

The memory device includes an array of flash memory cells 330 that can be NROM flash memory cells incorporating high-k gate dielectrics formed by low temperature oxidation of metals. The memory array 330 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture or a NOR architecture.

An address buffer circuit 340 is provided to latch address signals provided on address input connections A0-Ax 342. Address signals are received and decoded by a row decoder 344 and a column decoder 346 to access the memory array 330. It will be appreciated by those skilled in the art, with the benefit of the present description, that the number of address input connections depends on the density and architecture of the memory array 330. That is, the number of addresses increases with both increased memory cell counts and increased bank and block counts.

The memory device 300 reads data in the memory array 330 by sensing voltage or current changes in the memory array columns using sense/buffer circuitry 350. The sense/buffer circuitry, in one embodiment, is coupled to read and latch a row of data from the memory array 330. Data input and output buffer circuitry 360 is included for bi-directional data communication over a plurality of data connections 362 with the controller 310. Write circuitry 355 is provided to write data to the memory array.

Control circuitry 370 decodes signals provided on control connections 372 from the processor 310. These signals are used to control the operations on the memory array 330, including data read, data write, and erase operations. The control circuitry 370 may be a state machine, a sequencer, or some other type of controller.

Since the NROM memory cells of the present invention use a CMOS compatible process, the memory device 300 of FIG. 3 may be an embedded device with a CMOS processor.

The flash memory device illustrated in FIG. 3 has been simplified to facilitate a basic understanding of the features of the memory. A more detailed understanding of internal circuitry and functions of flash memories are known to those skilled in the art.

CONCLUSION

In summary, an NROM cell uses a high-k gate dielectric as the trapping layer. The high-k metal dielectric has been formed using atomic layer deposition, evaporation, or other processes with low temperature oxidation.

The NROM flash memory cells of the present invention may be NAND-type cells, NOR-type cells, or any other type of array architecture. These architectures are well known in the art.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. An NROM device comprising:
a memory array having a plurality of NROM memory transistors arranged in a row and column format, each transistor comprising:
a substrate having a plurality of source/drain regions, the source/drain regions having a different conductivity than the remainder of the substrate;
a composite high-k-low-k-high-k nanolaminate gate insulator formed by oxidation of metals overlying the substrate and substantially between the plurality of source/drain regions; and
a control gate formed on top of the gate insulator;
wherein a thickness of at least one of the high-k layers of the gate insulator is controlled during the oxidation of metals to maintain an excess of metal in that high-k layer.

2. The NROM device of claim 1 wherein the substrate of each transistor is comprised of a p-type conductivity silicon and the source/drain regions are n+ doped regions in the substrate and the gate insulator is formed substantially between the source/drain regions.

3. An electronic system comprising:
a processor that generates control signals; and
a memory device coupled to the processor, the device comprising a plurality of NROM memory cells, each NROM memory cell comprising:
a substrate having a plurality of source/drain regions, the source/drain regions having a different conductivity type than the remainder of the substrate;
a composite high-k-low-k-high-k nanolaminate gate insulator overlying the substrate wherein at least one high-k layer of the gate insulator is formed by an oxidation of metal, the high-k layers having a dielectric constant greater than a dielectric constant of silicon dioxide; and
a control gate formed on top of the gate insulator;
wherein a thickness of at least one of the high-k layers of the gate insulator is controlled during the oxidation of metal to maintain an excess of metal in that high-k layer.

4. The system of claim 3 wherein the memory device is a NAND memory device with the NROM cells arranged in a NAND architecture.

5. The system of claim 3 wherein the memory device is a NOR memory device with the NROM cells arranged in a NOR architecture.

6. The system of claim 3 wherein the memory device further includes control circuitry that interfaces with the processor.

7. An NROM memory transistor comprising:
a substrate having a plurality of source/drain regions, the source/drain regions having a different conductivity type than the remainder of the substrate;
a composite high-k-low-k-high-k nanolaminate gate insulator wherein at least one high-k layer is formed by an oxidation of metal overlying the substrate, a high dielectric constant is greater than a dielectric constant of silicon dioxide; and
a control gate formed on top of the gate insulator;
wherein a thickness of at least one of the high-k layers of the gate insulator is controlled during the oxidation of metal to maintain an excess of metal in that high-k layer.

8. The transistor of claim 7 wherein the transistor is adapted for use in either a NOR-type flash memory structure or a NAND-type flash memory structure.

9. The transistor of claim 7 wherein the transistor is coupled to and embedded with a CMOS processor.

10. The transistor of claim 7 wherein all of the high-k layers are formed by low temperature oxidation of metals.

11. The transistor of claim 10 wherein the gate insulator includes a charge trapping layer that is comprised of a material having a lower conduction band edge than silicon nitride.

12. A memory array comprising:
a plurality of NROM memory transistors arranged in a row and column format, each transistor comprising:
a substrate having a plurality of source/drain regions, the source/drain regions having a different conductivity than the remainder of the substrate;
a composite high-k-low-k-high-k nanolaminate gate insulator formed by oxidation of metals overlying the substrate and substantially between the plurality of source/drain regions; and
a control gate formed on top of the gate insulator;
wherein a thickness of at least one of the high-k layers of the gate insulator is controlled during the oxidation of metals to maintain an excess of metal in that high-k layer.

13. The memory array of claim 12 wherein the array is coupled to and embedded with a CMOS processor.

14. The memory array of claim 12 wherein the composite gate insulator of each transistor is formed by low temperature oxidation.

15. The memory array of claim 12 wherein the plurality of source/drain regions of each transistor are comprised of an n+ type doped silicon.

16. The memory array of claim 12 wherein the control gate of each transistor is a polysilicon material.

17. The memory array of claim 12 wherein the substrate of each transistor is comprised of a p-type silicon material.

18. The memory array of claim 12 wherein the composite gate insulator is formed at least in part by one of atomic layer deposition (ALD), an evaporation technique, a combination of the ALD and evaporation.

* * * * *